(12) United States Patent
Jost (10) Patent No.: US 8,501,528 B2
(45) Date of Patent: Aug. 6, 2013

(54) RADIOFREQUENCY PLASMA REACTOR AND METHOD FOR MANUFACTURING VACUUM PROCESS TREATED SUBSTRATES

(75) Inventor: Stephan Jost, Azmoos (CH)

(73) Assignee: Tel Solar AG, Trubbach (CH)

( * ) Notice: Subject to any disclaimer, the term of this patent is extended or adjusted under 35 U.S.C. 154(b) by 68 days.

(21) Appl. No.: 13/121,743

(22) PCT Filed: Sep. 28, 2009

(86) PCT No.: PCT/EP2009/062538
§ 371 (c)(1),
(2), (4) Date: May 13, 2011

(87) PCT Pub. No.: WO2010/037716
PCT Pub. Date: Apr. 8, 2010

(65) Prior Publication Data
US 2011/0217806 A1      Sep. 8, 2011

Related U.S. Application Data

(60) Provisional application No. 61/101,736, filed on Oct. 1, 2008.

(51) Int. Cl.
*H01L 21/00*      (2006.01)
(52) U.S. Cl.
USPC .................. 438/98; 257/E21.486; 118/723 E (58) Field of Classification Search
USPC ................... 438/97; 257/E21.483, E21.485, 257/E21.486
See application file for complete search history.

(56) References Cited

U.S. PATENT DOCUMENTS

| | | | |
|---|---|---|---|
| 6,228,438 B1 | 5/2001 | Schmitt | |
| 6,433,297 B1 * | 8/2002 | Kojima et al. | 118/723 E |
| 7,141,516 B2 * | 11/2006 | Kawamura et al. | 438/795 |
| 2001/0023742 A1 | 9/2001 | Schmitt | |
| 2005/0211384 A1 | 9/2005 | Hayashi | |

FOREIGN PATENT DOCUMENTS

| | | |
|---|---|---|
| EP | 0953204 A | 11/1999 |
| EP | 1594161 A1 | 11/2005 |
| EP | 1665323 A | 6/2006 |
| WO | 98/32154 A1 | 7/1998 |
| WO | 2005/024891 A2 | 3/2005 |

OTHER PUBLICATIONS

International Search Report for PCT/EP2009/062538 dated Jan. 29, 2010.
Written Opinion for for PCT/EP2009/062538 dated Jan. 29, 2010.

* cited by examiner

*Primary Examiner* — Chandra Chaudhari
(74) *Attorney, Agent, or Firm* — Pearne & Gordon LLP (57) ABSTRACT

An electrode ($3_i$) of a radiofrequency parallel plate plasma reactor includes an electrode surface of a multitude of surfaces of metal members (28) which reside on dielectric spacing members (29), whereby the metal members (28) are mounted in an electrically floating manner. The dielectric members (29) are mounted, opposite to the metal members (28), upon a metal Rf supply body ($14_a$).

19 Claims, 3 Drawing Sheets

RADIOFREQUENCY PLASMA REACTOR AND METHOD FOR MANUFACTURING VACUUM PROCESS TREATED SUBSTRATES

CROSS-REFERENCE TO RELATED APPLICATIONS

The present application is a continuation application of International Application PCT/EP2009/062538, filed on Sep. 28, 2009, which claims the benefit of U.S. provisional application Ser. No. 61/191,736, filed on Oct. 1, 2008; the content of which is incorporated herein by reference.

BACKGROUND

1. Field

The present invention is directed on a radiofrequency plasma reactor, a vacuum treatment system comprising such reactor and on a method for manufacturing a vacuum process treated substrate.

2. Description of Related Art

Plasma is commonly understood as an ionized gas comprising ions and electrons. The plasma is electrically conductive and strongly responds to electromagnetic fields. Plasma is often generated by an electric discharge in a vacuum wherein a working gas, normally a noble gas like argon, is introduced and ionized in an electromagnetic field to result in ions and electrons. Additionally or instead of such working gas it is common praxis, depending upon the treatment of a substrate to be performed with the help of such plasma, to introduce a reactive gas into the plasma discharge space which is activated in the electromagnetic field. The activated reactive gas directly interacts with a surface of a substrate to be treated or forms a reaction product in the plasma discharge, which latter interacts with the addressed surface. There are a large number of reactive gases which are exploited for vacuum plasma treatment of substrate surfaces. We refer to a few examples as hydrogen, nitrogen, silane, $SF_6$. The reactive gases are selected according to the desired treatment of substrate surface. Such a treatment may be e.g. deposition of a solid material layer upon the substrate surface, surface treatment of the addressed surface as e.g. by oxidizing, etching, thereby unselectively or selectively removing material from the substrate surface, or heating the substrate. The present invention is thereby especially directed on such a treatment of large substrate surfaces, which have an extent of at least 1 $m^2$. Thereby, we speak of "a substrate" thereby understanding either one distinct substrate or two or more distinct substrates which are simultaneously treated and which concomitantly have a surface to be treated of the addressed at least 1 $m^2$.

The treatment of large substrate surfaces, especially of single piece substrates, is required e.g. for manufacturing substrates in the frame of TFT panel manufacturing or for manufacturing photovoltaic panels.

Thereby, it is known in this art to perform such a treatment in a vacuum plasma which is operated by an electrical supply generating plasma discharge by means of electric power which at least comprises a significant Rf component. We generically address such a plasma as a radiofrequency plasma. Generically, the electric supply for a radiofrequency plasma may comprise additionally to radiofrequency components lower-frequency components down to DC and may be applied as a pulsating signal or as a more continuous wave signal.

We thereby understand in the frame of the present application under "radiofrequency" frequencies which are at least 5 MHz.

Figure 1:
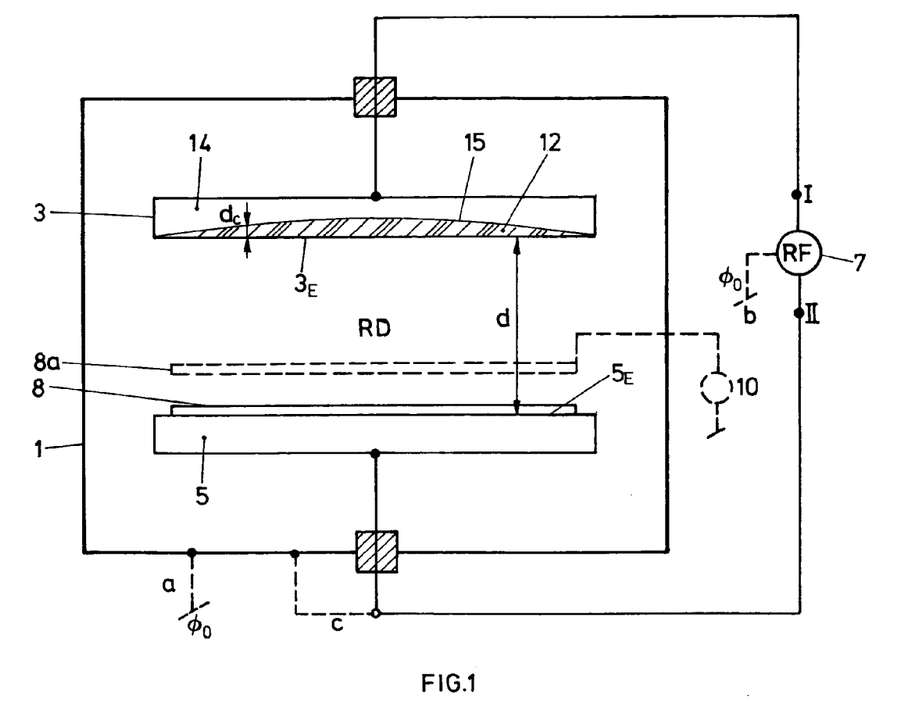
FIG. 1 is a diagram illustrating an example of a related Rf plasma reactor.

In the art of vacuum plasma processing substrates so-called parallel plate reactors are widely known. Such parallel plate reactors are thereby also widely known conceived as Rf plasma reactors. As shown in FIG. 1 such a known Rf plasma reactor comprises a vacuum recipient 1, wherein there is provided a first electrode arrangement 3 and a second electrode arrangement 5. The first electrode arrangement 3 defines for a first electrode surface $3_E$, whereas the second electrode arrangement 5 defines for a second electrode surface $5_E$. The first and second electrode surfaces $3_E$ and $5_E$ are distant from each others and face each others. They define concomitantly the plasma discharge space PD. Depending upon the specific purpose of such radiofrequency plasma reactor with respect to substrate surface treatment the two electrode surfaces $3_E$ and $5_E$ define for a spacing distance d along the addressed surfaces which is constant all along the surface area along which the electrode surfaces $3_E$, $5_E$ face each other or define for a distance d which may vary along the addressed extent. In the case of constant distance d along the electrode surface area along which the electrode surfaces face each other it is known as shown in FIG. 1 to tailor the electrode surfaces $3_E$, $5_E$ to be plane.

Both electrode arrangements 3 and 5 are operationally connected to pole I, II respectively of an electric Rf supply unit 7. Thereby, different possibilities are known to operate the Rf supply unit 7 with respect to an electric reference potential $\Phi_o$, i.e. with respect to ground potential. As shown in FIG. 1 at "a" one possibility is to operate the Rf supply unit 7 in an electrically floating manner with respect to the recipient 1. A second possibility shown in dash line in FIG. 1 and referenced by "b" is to operate the recipient at reference potential and additionally to operate the Rf supply unit 7 on reference potential so as to apply either symmetrically or asymmetrically Rf power to the respective electrode arrangements 3 and 5. A further possibility also shown in FIG. 1 and addressed by reference "c" is to operate one of the electrode arrangements 3 or 5 on reference potential as well. In such a reactor a substrate is provided either deposited on one of the electrode surfaces as shown in FIG. 1 at reference No. 8, thereby and if one of the electrode arrangements is operated on reference potential customarily on the electrode surface of that electrode arrangement. Alternatively and as shown in FIG. 1 in dash line at $8_a$ the substrate may be operated in the plasma discharge space remote from both electrode surfaces, thereby electrically floating or tightened on an electric bias potential as shown in dash line in FIG. 1 at 10, which bias may be DC and/or AC. When we address the substrate $8_a$ being operated electrically floatingly we mean that the electric potential whereupon the substrate $8_a$ resides during treatment operation establishes for electric potential distribution within the plasma discharge space PD.

For treating large substrates as addressed above obviously the electrode arrangement and thereby the electrode surfaces must be tailored with respective extents which are at least similar with the extent of the substrate, customarily even larger. Thereby and dependent on one hand from the substrate extent and on the other hand on the frequency of the Rf power operating the plasma discharge, the dimension of the electrode surfaces on one hand and the wavelength of the Rf signal become of comparable extent.

Thereby, standing waves phenomena are likely to occur in the plasma discharge space resulting in an inhomogeneous distribution of plasma treatment effect along the surface of the substrate.

From the U.S. Pat. No. 6,228,438 it is known to counteract the addressed phenomenon by providing at one of the electrode arrangements 3 or 5 according to FIG. 1 a dielectric spacing 12. The dielectric spacing 12 of a dielectric solid material, e.g. a ceramic material, and/or realized by a void compartment resides on a metal Rf supply electrode 14 which is operationally connectable to the first pole I of the Rf power supply unit 7. The dielectric spacing 12 forms between the electrode surface $3_E$ and a metal surface 15 of the supply electrode 14 a capacitive arrangement. As exemplified in FIG. 1 the spacing $d_c$ measured perpendicularly to the respective surface area of the supply electrode 14 varies along the extent of the addressed surface 15 and thus along the extent of the electrode surface $3_E$. Thereby, there is established a distributed capacitive Rf coupling between the supply electrode 14 and the electrode surface $3_E$ with a coupling capacitance value which varies along the extent of the electrode surface $3_E$. The result is that the occurrence of standing waves is substantially prevented for the treatment of large substrates at Rf frequencies above 10 MHz.

With an eye on FIG. 1 please note that it is a schematic representation of the Rf plasma reactor wherein additional members as e.g. vacuum pumping units, gas supply members, loadlocks, etc. have not been shown.

From the EP 0 953 204 it is further known to conceive one of the electrode surfaces of a Rf plasma reactor as generically shown in FIG. 1 by a pattern of mutually electrically isolated metal electrode members which are in groups operated on distinct electric potentials.

Turning back to the approach according to the U.S. Pat. No. 6,228,438 the dielectric spacing 12 is commonly and at least to a predominant part made of a ceramic material. Thereby, the addressed ceramic material of the dielectric spacing is exposed during treatment of the substrate to high thermical loading and, depending upon the selected treatment, to the effect of aggressive reactive gases or reaction products thereof. This is at least one important reason to select for conceiving the dielectric spacing a ceramic material. Such ceramic material is difficult and expensive in manufacturing and shaping and is brittle, a drawback e.g. for assembly, operation and maintenance. Providing cooling systems, as e.g. a system of piping for a cooling medium within such ceramic material dielectric spacing, is extremely difficult to realize and thus costly.

SUMMARY

It is an object of the present invention to remedy the addressed drawbacks. This is achieved by a radiofrequency plasma reactor which comprises a vacuum recipient and, therein, a first electrode arrangement which has a first electrode surface and a second electrode arrangement having a second electrode surface. The first and the second electrode surfaces are distant from each other and face each other, thereby defining a plasma discharge space therebetween. The first electrode arrangement comprises a metal Rf supply electrode which is operationally connectable to a first pole of an Rf power supply and which has a metal surface which extends substantially along and distant from the first electrode surface. There is further provided a dielectric spacing upon the metal surface which extends substantially along the metal surface. The thickness of the dielectric spacing, perpendicular to the metal surface, varies along the metal surface of the metal Rf supply electrode. The second electrode arrangement is operationally connectable to a second pole of the Rf power supply.

The first electrode surface thereby comprises a multitude of surfaces of a multitude of metal members which reside on the dielectric spacing, whereby at least the majority of the number of the addressed metal members is mounted in an electrically floating manner.

Thus a predominant area of the dielectric spacing is covered by metal members. Due to their electrically floating mount they nevertheless allow the respective capacitive coupling through the dielectric spacing to vary along the extent of the first electrode surface. Nevertheless, the metal members provide for a substantial shielding of the dielectric spacer from thermical loading and possibly from aggressive process atmosphere. Thereby, the freedom with respect to selecting the dielectric material to conceive the dielectric spacer becomes substantially enlarged, and, additionally, the metal tiles do allow—where desired—to provide cooling facilities for the electrode surface and thereby for the overall first electrode arrangement.

In one embodiment of the reactor according to the present invention, which may be combined with all subsequently addressed embodiments, unless being in contradiction therewith, the first and second electrode surfaces are distant from each other with a substantially constant distance along the electrode surfaces.

In another embodiment of the reactor according to the present invention, which may be combined with any preaddressed and subsequently addressed embodiment, unless in contradiction, the first electrode surface is substantially plane.

In still another embodiment of the reactor according to the present invention, which may be combined with any of the preaddressed and of the subsequently addressed embodiments, unless in contradiction, the dielectric spacer comprises dielectric solid material, in one form of realization consists of dielectric solid material.

Still in another embodiment of the reactor according to the invention, which may be combined with any of the preaddressed and of the subsequently addressed embodiments, unless in contradiction, solid dielectric material of the dielectric spacing which is buried under the metal members, comprises not ceramic dielectric material. Thereby, e.g. polytetrafluorethylene (PTFE) or another suitable plastic material can be applied as material of the dielectric spacing buried or hidden behind the metal members.

In a further embodiment of the reactor according to the invention, which may be combined with any of the preaddressed and of the subsequently addressed embodiments, unless in contradiction, at least a part of the members do comprise a tube arrangement which is connectable to a source of a cooling medium. Thereby, e.g. and especially members which are mounted adjacent to the border of the first electrode arrangement may actively be cooled by flowing a cooling medium through the respective tube arrangement.

Still in another embodiment of the reactor according to the invention, which may be combined with any of the preaddressed and of the subsequently addressed embodiments, unless in contradiction, the metal surface of the metal Rf supply electrode is a smooth surface or is a stepped surface. By tailoring the addressed metal surface as a stepped surface it becomes possible on one hand to establish varying distances between the metal surface and the electrode surface to be bridged by at least one respective dielectric solid material insert and on the other hand to provide an accurate positioning and mounting surface for such a dielectric material insert. Tailoring the addressed metal surface of the Rf supply electrode as a smooth surface facilitates manufacturing of the Rf supply electrode.

In a further embodiment of the reactor according to the invention, which may be combined with any of the preaddressed and of the subsequently addressed embodiments, unless in contradiction, the metal surface of the Rf supply electrode comprises intrusions of different depth.

In a further embodiment of the reactor according to the invention the interspaces between the members are void and/ or the interspaces between the members are filled with a dielectric solid material. By the addressed interspaces we address the spaces bridging laterally one member from neighboring members. If the addressed interspaces are void, these interspaces are tailored to avoid the plasma discharge to expand therein. As perfectly known to the skilled artisan, this is achieved by tailoring such interspaces with a width which is smaller than the dark space distance at the respectively desired processing conditions. If the addressed spacing is filled with dielectric solid material, only a small amount of the overall electrode surface is of such dielectric solid material and exposed to thermal loading and process atmosphere loading.

In another embodiment of the reactor according to the invention, which may be combined with any of the preaddressed and of the subsequently addressed embodiments, unless in contradiction, the reactor comprises a substrate holder on the second electrode surface.

In another embodiment of the reactor according to the invention, which may be combined with any of the preaddressed and of the subsequently addressed embodiments, unless in contradiction, the second electrode surface is of a metal.

Still in a further embodiment of the reactor according to the invention, which may be combined with any of the preaddressed and of the subsequently addressed embodiments, unless in contradiction, the reactor comprises a substrate holder with an extent of at least 1 m².

The present invention is further directed on a vacuum treatment system which comprises a reactor according to the invention in any of the addressed embodiments or combinations thereof, wherein the first and second poles are operationally connected to an Rf supply unit which operates at a frequency of at least 10 MHz, thereby preferably at a frequency larger than 20 MHz, even more preferred operating at a second or higher order harmonics of 13.56 MHz.

The present invention is further directed on a method for manufacturing a vacuum process treated substrate for a TFT or for a solar cell panel with an extent of at least 1 m² which comprises the steps of providing a radiofrequency plasma reactor which comprises a vacuum recipient and therein a first electrode arrangement having a first electrode surface and a second electrode arrangement having a second electrode surface. Thereby, the first and second electrode surfaces are distant from each other and face each other. They define a plasma discharge space therebetween. The first electrode arrangement comprises a metal Rf supplied electrode which is operationally connectable to a first pole of an Rf power supply and has a metal surface which extends substantially along and distant from the first electrode surface. There is further provided a dielectric spacing upon the metal surface which extends substantially along the metal surface. The thickness of the dielectric spacing, perpendicular to the metal surface, varies along the metal surface. The second electrode arrangement is operationally connectable to a second pole of an Rf power supply. Further, the first electrode surface comprises a multitude of surfaces of a multitude of metal members which reside on the dielectric spacing, at least the majority of the tiles being mounted in an electrically floating manner.

The poles are operationally connected to an Rf power supply unit which operates at a frequency of at least 10 MHz. The substrate to be treated is provided in the plasma discharge space and a gas or gas mixture is inlet into the plasma discharge space. The substrate is treated in a plasma generated in the plasma discharge space and electrically supplied by the power supply unit in an atmosphere which contains the addressed gas or gas mixture. Thereby, in one embodiment there is provided a reactor as was addressed under the different aspects and embodiments of the reactor according to the present invention.

BRIEF DESCRIPTION OF THE DRAWINGS

The invention shall now further be further exemplified with the help of figures.

DETAILED DESCRIPTION

Because the present invention is based on an Rf plasma reactor as described in context of FIG. 1, we base the following description on such reactor and address predominantly the differences according to the invention.

Figure 2:
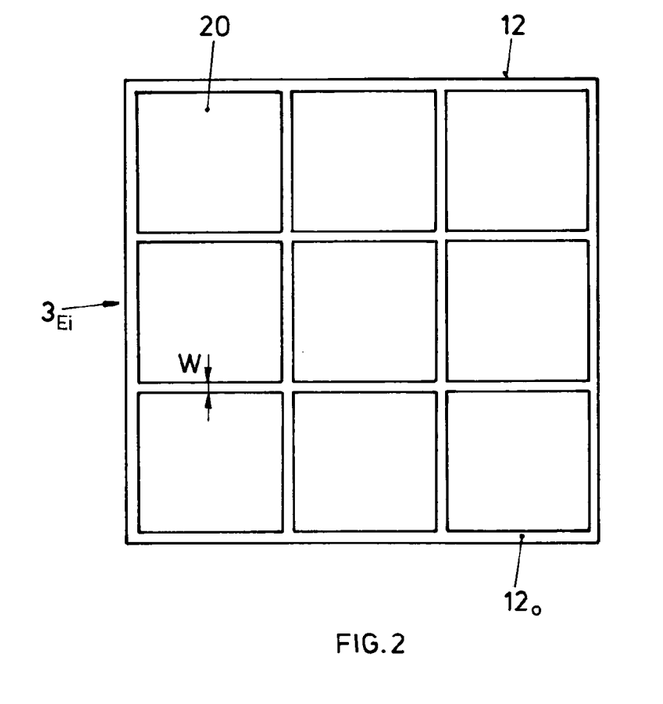
FIG. 2 is a schematic diagram illustrating an example of a top view upon an electrode surface of a reactor according to the present invention for performing the manufacturing method of the invention in one possible variant.

FIG. 2 schematically shows a top view upon a first electrode arrangement $3_i$ according to electrode arrangement 3 of FIG. 1. The electrode surface which accords with the surface $3_E$ of FIG. 1 and is addressed by reference number $3_{Ei}$ in FIG. 2, comprises the surfaces of a multitude of square-shaped metal tile members 20. The metal tile members 20 are mounted upon the dielectric spacing 12 as of FIG. 1, which is in this embodiment conceived of solid dielectric material. The surface of the dielectric spacing 12 upon which the metal tile members 20 are mounted is denoted in FIG. 2 by reference number $12_o$. It is to be noted that the tile members 20 are mutually spaced from each others and are each mounted on the dielectric spacing 12 in an electrically floating manner. In the embodiment of FIG. 2 the lateral spacing between neighboring metal tile members 20 is void so that a pattern of channels formed between the metal tile members 20 is exposed to the plasma discharge space PD as of FIG. 1. So as to prevent the plasma to expand into the addressed channels, their width w is dimensioned to be smaller than dark space distance, which will be established by the process parameters of the process to be operated in the Rf vacuum recipient.

Figure 3:
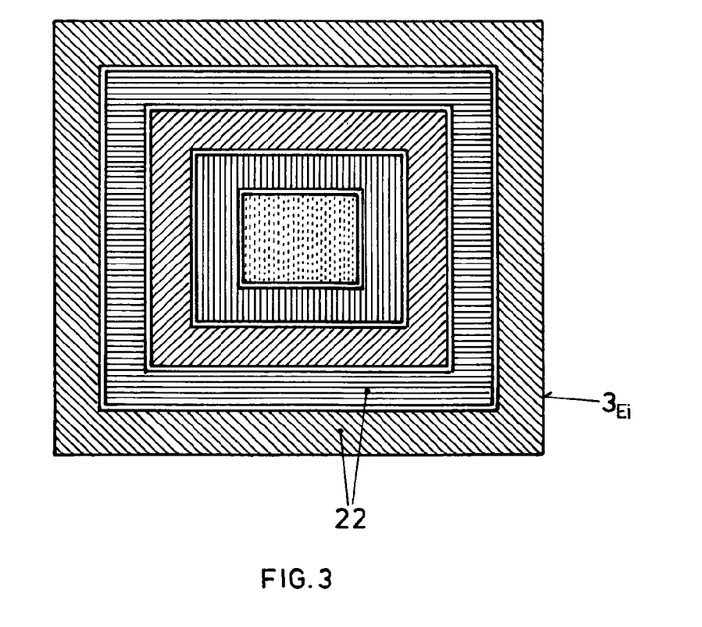
FIG. 3 is a schematic diagram illustrating an example of a view according to FIG. 2 in a second variant.

FIG. 3 shows in analogy to the representation of FIG. 2 an embodiment whereat the metal tile members 22 co-defining the electrode surface $3_{Ei}$ are shaped as rectangular frames and disposed nested within one other. For the void spacing between the frame-like tiles and for their electrically floating mount upon the dielectric spacing the same prevails as was addressed in context with the embodiment of FIG. 2.

Clearly and also dependent from the shape of the electrode surface being square, circular etc., the shape of the members is accordingly selected. Generically, the members need not to be of equal shape and/or of equal extent to form part of one and the same electrode surface $3_{Ei}$.

Further, although the majority of metal members being mounted in an electrically floating manner, in some cases it might be advantageous to operate a certain number of the members either tightened on the same electric potential as the metal supply electrode 14 of FIG. 1 or even on an electric potential which is different from that electric potential of the metal Rf supply electrode 14.

Figure 4:
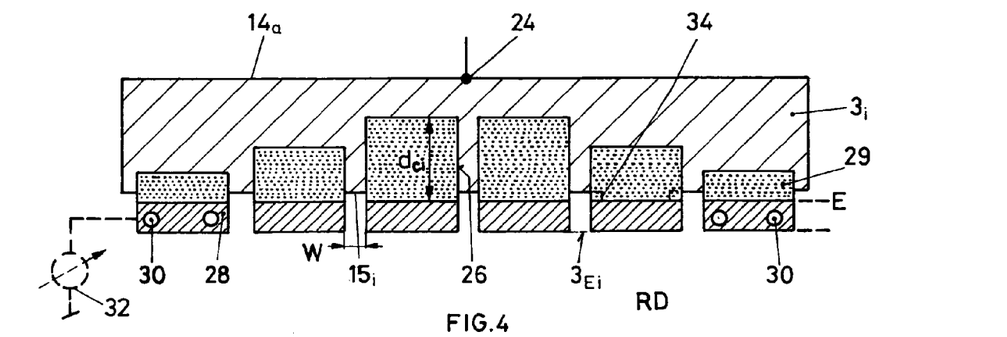
FIG. 4 is a schematic diagram illustrating an example of a cross-section through one embodiment of an electrode arrangement in a reactor according to the present invention for performing the method of manufacturing according to the invention.

FIG. 4 schematically shows a cross-section of one embodiment of first electrode arrangement $3_i$ in analogy to first electrode arrangement 3 as of FIG. 1. The metal Rf supply electrode $14_a$ comprises an Rf connection 24 by which it may be operationally connected to one pole—I—of Rf supply unit 7 as of FIG. 1. The metal surface $15_i$ of the metal Rf supply electrode $14_a$ comprises a multitude of recesses 26 which are rectangular in cross-section and thus form a stepped surface. In top view the recesses 26 accord with the respective shapes of metal members 28. Thus, if the metal members 28 are, as an example, shaped according to FIG. 2 the recesses 26 are accordingly rectangular in top view. If as a further example the metal members 28 are shaped frame-like as of embodiment in FIG. 3, the recesses 26 are frame-like as well in top view. As may be seen from FIG. 4 the recesses 26 are of respective depths $d_{ci}$ according to the thickness $d_c$ of FIG. 1 which vary along the extent of the electrode arrangement $3_i$. Within the recesses 26 dielectric spacing inserts 29 are mounted, the shape of which, considered in top view upon the electrode arrangement $3_i$, again fitting with the shapes of the metal members 28. Upon the dielectric spacing inserts 29 the metal members 28 are mounted. In the embodiment of FIG. 4 all metal members 28 are of equal thickness. So as to define a substantially plane electrode surface $3_{Ei}$ the dielectric spacing members 28 define at their ends pointing towards the plasma discharge space PD a plane E. Nevertheless, it must be emphasized that the electrode surface $3_{Ei}$ needs not necessarily be plane. It might be, as an example, convexly or concavely bent. This would be realized by applying metal members 28 of respectively different thicknesses and/or by defining with the help of the dielectric spacing inserts 29 a respectively bent surface whereupon the metal members 28 are applied. So as to prevent low ohmic short circuiting neighboring metal members 28, the width w between neighboring members 28 is, as was addressed, selected so that for the desired processing parameters as e.g. pressure, of the intended plasma discharge, no plasma penetrates into the interspaces between the members 28, which is achieved by tailoring the addressed width w to be smaller than dark space distance, which results at the desired processing.

As may further be seen from FIG. 4 the dielectric inserts 29 are shielded towards the plasma discharge space PD by the metal members 28. Therefore, it becomes possible to apply as a material of the dielectric inserts 29 a dielectric material which is less resistant to thermal loading and/or to reactive gases and their products in the plasma discharge space PD than ceramic material. Thus, instead of a ceramic material as material of the dielectric inserts 29, plastic material may be applied as e.g. PTFE (polytetrafluorethylene). Further, at least a part of the metal members 28 may be equipped with cooling facilities as with tubes 30 for flowing a cooling medium therethrough as shown at 30 for the outermost members 28. Further and as shown in FIG. 4 in dash line, it might be desired to tighten a part of the metal members 28 on a desired, possibly varying electric potential which may be DC, DC+AC or AC and which even might be the Rf potential which is applied to the connection 24, but possibly phase-shifted. This is shown in FIG. 4 by the member-specific supply unit 32.

It is further also possible in the embodiment of FIG. 4 to leave the recesses or at least some of the recesses 26 void and to deposit respective metal members 28 upon dielectric solid material spacers 34 as shown in dash line in FIG. 4 to establish capacitive coupling between the metal Rf supply electrode $14a$ and respective metal members via a vacuum capacitance. More generically, it may be desired to select for the material of the dielectric inserts 29 vacuum and/or solid materials of different dielectric characteristics, as capacitive coupling is primarily governed by the respective distances $d_{ci}$ and the dielectric characteristics of the material within the recesses 26 forming the dielectric spacing.

Figure 5:
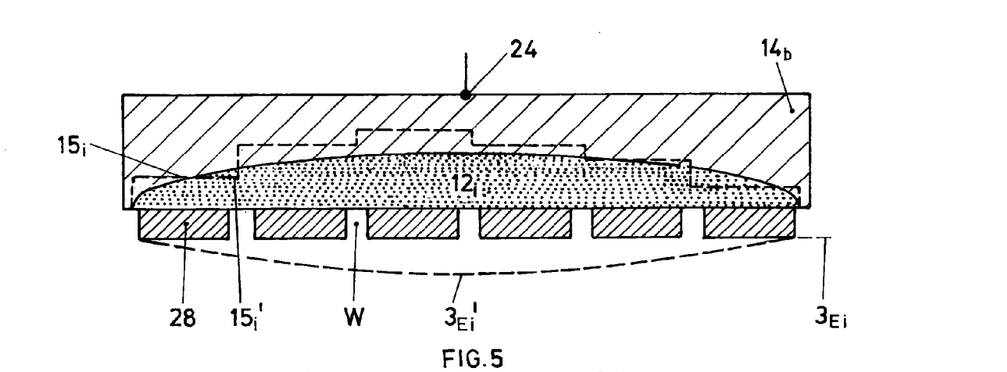
FIG. 5 is a schematic diagram illustrating an example of a further embodiment of the electrode arrangement in a representation in analogy to that of FIG. 4.

FIG. 5 shows in a schematic representation in analogy to that of FIG. 4 a further embodiment of electrode arrangement 3, denoted in FIG. 5 by $3_i$. As perfectly clear to the skilled artisan the difference between the embodiment as of FIG. 5 with respect to the embodiment as of FIG. 4 is that in FIG. 5 there is applied, in analogy to the representation in FIG. 1, a continuous-body dielectric spacing $12_i$. Thereby, additionally, the metal surface $15_i$ on the metal Rf supply electrode $14_b$ is a smooth, continuous surface. Nevertheless and as shown in dash line in FIG. 5 at $15_i'$ it is also possible to conceive the surface $15_i$ in a stepped manner.

Also in this embodiment and in view of the fact that, as was addressed in context with FIG. 4, the spacing between neighboring members 28 is conceived with a width w which substantially prevents the plasma discharge to penetrate into the respective spacing, it becomes possible to select, as a solid material for the dielectric spacing $12_i$, a material which is less resistant especially to thermical loading than ceramic material. Again, PTFE or another plastic material might be selected as dielectric material filling or partially filling the dielectric spacing $12_i$.

With respect to applying cooling facilities as well as tightening to desired electrical potentials of parts of the members 28 the same prevails as was addressed in context with the embodiment of FIG. 4. Further, the electrode surface $3_{Ei}$ of FIG. 5, which is defined by the metal surface of the members 28, may be plane as shown in FIG. 5, but may, if desired, be different from plane as e.g. concavely or convexly bent. An embodiment with convexly bent electrode surface $3_{Ei}$ is shown in FIG. 5 in dash line at $3_{Ei}'$. The shape of the members 28 in the embodiment of FIG. 5 too may be appropriately selected, e.g. to be square according to the embodiment of FIG. 2 or to be frame-like as of the embodiment of FIG. 3.

Figure 6:
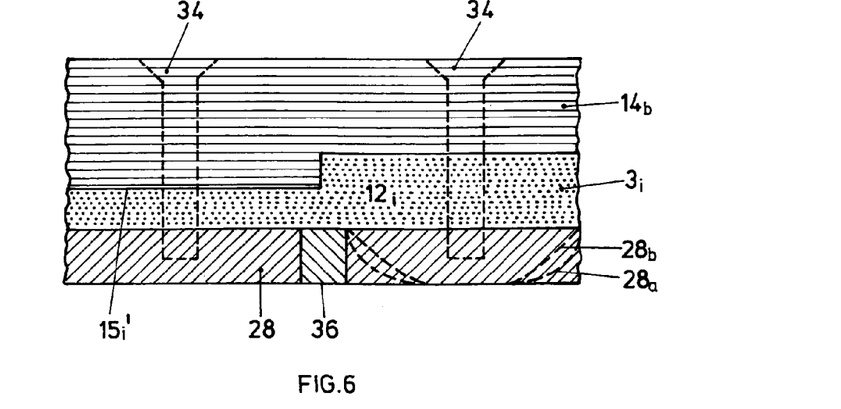
FIG. 6 is a schematic diagram illustrating an example of a cross-section through a part of an electrode arrangement in a reactor according to the invention for performing the manufacturing method according to the invention.

FIG. 6 shows again schematically a cross-section through a part of a first electrode arrangement $3_i$ which is principally conceived according to the embodiment of FIG. 5, but wherein according to the surface $15_i'$ of the embodiment of FIG. 5, the metal surface of the metal Rf supply electrode $14_b$ is stepped. Irrespective of the shaping of the metal surface $15_i$ and of the realization of the dielectric spacing 12, e.g. according to the embodiment of FIG. 4 or, as shown in FIG. 6 rather according to the embodiment of FIG. 5, this fig. shall exemplify how the metal members 28 may be mounted. According to FIG. 6 the metal members 28 irrespective of their selected shapes are mounted to the metal Rf supply electrode 14 by means of bolts or screws 34 of dielectric material. Alternatively, the screws or bolts 34 may be of a metal, but then they have to be electrically isolated from the metal Rf supply electrode 14 and/or from the respective member 28. Nevertheless, such isolation contributes to the capacitive coupling between the metal Rf supply electrode 14 and the respective metal members 28 and must therefore be taken into account when conceiving the overall electrode arrangement which is customarily done by computer-aided simulation of Rf field distribution in the plasma discharge space of the reactor.

As in all embodiments described up to now and as was already addressed, the dielectric spacing may be realized by dielectric solid material spacing and/or by vacuum compartment spacing.

As further shown in FIG. 6 the spacing between members 28 may be filled by dielectric material spacers 36. By such dielectric spacers 36 it becomes possible to ensure mutual floating operation of the metal members 28 even if the spacing w between neighboring metal tiles is selected to be larger than the addressed dark space distance. Further, providing such dielectric spacers 36 filling the spaces between neighboring metal members 28 protects the dielectric spacing 12$_i$ from ion and electron bombardment, which may hardly be avoided even if, at void spacings between neighboring metal members 28, the spacing w is selected to be smaller than the dark space distance. Further and with an eye on FIG. 6 it might be possible to provide a unitary grid of dielectric spacers 36 which may be interposed into the spaces between the metal members 28 as a separate part and which thus may be exchanged easily. Thereby, the dielectric material of the spacer or the spacer arrangement 36 may be selected to be less resistant to thermical loading and to exposure to processing gas than ceramic material, as it may be easily exchanged or replaced.

Further, and as shown in FIG. 6 in dash line, the members may be shaped in a desired cross-sectional profile as shown at 28$_a$ or at 28$_b$. Irrespective of such cross-sectional profiling the interspaces between neighboring metal tiles 28$_a$, 28$_b$ may be left void or may be filled with dielectric spacers 36 as was addressed.

What is claimed is:

1. A radiofrequency plasma reactor comprising a vacuum recipient and therein a first electrode arrangement having a first electrode surface and a second electrode arrangement having a second electrode surface, said first and second electrode surfaces being distant from each other and facing each other, thereby defining a plasma discharge space there between, the first electrode arrangement comprising a metal Rf supply electrode and dielectric spacing, the metal Rf supply electrode being operationally connectable to a first pole of an Rf power supply and having a metal surface extending substantially along and distant from said first electrode surface, the dielectric spacing being upon said metal surface and extending substantially along said metal surface, a thickness of said dielectric spacing being perpendicular to said metal surface and varying along said metal surface, said second electrode arrangement being operationally connectable to a second pole of an Rf power supply,
    wherein said first electrode surface comprises a multitude of surfaces of a multitude of metal members residing on said dielectric spacing, at least the majority of said members being mounted in an electrically floating manner.

2. The reactor of claim 1, wherein said first and second electrode surfaces are distant with a substantially constant distance along said surfaces.

3. The reactor of claims 1 or 2, wherein said first electrode surface is substantially a plane.

4. The reactor of claim 1, wherein said dielectric spacing comprises dielectric solid material.

5. A radiofrequency plasma reactor, comprising:
    a vacuum recipient, comprising a first electrode arrangement having a first electrode surface and a second electrode arrangement having a second electrode surface, the first and second electrode surfaces being distant from each other and facing each other, thereby defining a plasma discharge space there between, the first electrode arrangement comprising a metal Rf supply electrode and dielectric spacing, the metal Rf supply electrode being operationally connectable to a first pole of an Rf power supply and having a metal surface extending substantially along and distant from the first electrode surface, the dielectric spacing being upon the metal surface and extending substantially along the metal surface, a thickness of the dielectric spacing being perpendicular to the metal surface and varying along the metal surface, the second electrode arrangement being operationally connectable to a second pole of an Rf power supply,
    wherein the first electrode surface comprises a plurality of surfaces of a plurality of metal members residing on the dielectric spacing, a majority or more of the metal members being mounted in an electrically floating manner, and
    wherein the solid dielectric material, which is buried behind the members, comprises a not-ceramic dielectric material.

6. The reactor of claim 1, wherein a part of the members comprises a tube arrangement operationally connectable to a source for a cooling medium.

7. The reactor of claim 1, wherein said metal surface is a smooth or a stepped surface.

8. A radiofrequency plasma reactor, comprising:
    a vacuum recipient, comprising a first electrode arrangement having a first electrode surface and a second electrode arrangement having a second electrode surface, the first and second electrode surfaces being distant from each other and facing each other, thereby defining a plasma discharge space there between, the first electrode arrangement comprising a metal Rf supply electrode and dielectric spacing, the metal Rf supply electrode being operationally connectable to a first pole of an Rf power supply and having a metal surface extending substantially along and distant from the first electrode surface, the dielectric spacing being upon the metal surface and extending substantially along the metal surface, a thickness of the dielectric spacing being perpendicular to the metal surface and varying along the metal surface, the second electrode arrangement being operationally connectable to a second pole of an Rf power supply,
    wherein the first electrode surface comprises a plurality of surfaces of a plurality of metal members residing on the dielectric spacing, a majority or more of the metal members being mounted in an electrically floating manner, and
    wherein the metal surface comprises intrusions of different depths.

9. The reactor of claim 1, wherein interspaces between said members are void and/or interspaces between said tiles are filled with a dielectric solid material.

10. The reactor of claim 1, further comprising a substrate holder on said second electrode surface.

11. The reactor of claim 1, said second electrode surface being of a metal.

12. The reactor of claims 1 or 10, comprising a substrate holder with an extent of at least 1 m².

13. A vacuum treatment system comprising a radiofrequency plasma reactor according to any one of claims 1, 5, and 8, said first and second poles being operationally connected to an Rf generator arrangement operating at a frequency of at least 10 MHz.

14. A method for manufacturing a vacuum process treated substrate for a TFT or for a solar cell panel with an extent of at least 1 m², the method comprising the steps of:
   providing a radiofrequency plasma reactor according to any one of claims 1, 5, and 8;
   operationally connecting said poles to an Rf power source operating at a frequency of at least 10 MHz;
   providing a substrate to be treated into said plasma discharge space;
   inletting a gas or gas mixture into said plasma discharge space; and
   treating said substrate in a plasma in said plasma discharge space, electrically supplied by said power source and in an atmosphere containing said gas.

15. The vacuum treatment system of claim 14, wherein the Rf generator arrangement operates at a frequency greater than 20 MHz.

16. The vacuum treatment system of claim 14, wherein the Rf generator arrangement operates at second or greater order harmonies of 13.56 MHz.

17. The reactor of claim 1, wherein the dielectric spacing has a curved cross-section.

18. The reactor of claim 1, wherein a shape of the dielectric spacing corresponds with a shape of the metal members residing on the dielectric spacing.

19. The reactor of claim 1, wherein the dielectric spacing comprises separate parts according to a shape of the metal members.

* * * * *

UNITED STATES PATENT AND TRADEMARK OFFICE
CERTIFICATE OF CORRECTION

PATENT NO. : 8,501,528 B2 Page 1 of 1
APPLICATION NO. : 13/121743
DATED : August 6, 2013
INVENTOR(S) : Stephan Jost It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 110 days.

Signed and Sealed this
Fifteenth Day of September, 2015

Michelle K. Lee
*Director of the United States Patent and Trademark Office*